(12) United States Patent
Lin

(10) Patent No.: US 9,991,215 B1
(45) Date of Patent: Jun. 5, 2018

(54) SEMICONDUCTOR STRUCTURE WITH THROUGH SUBSTRATE VIA AND MANUFACTURING METHOD THEREOF

(71) Applicant: NANYA TECHNOLOGY CORPORATION, Taoyuan (TW)

(72) Inventor: Po-Chun Lin, Changhua (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days. days.

(21) Appl. No.: 15/410,430

(22) Filed: Jan. 19, 2017

(51) Int. Cl.
*H01L 23/58* (2006.01)
*H01L 23/48* (2006.01)
*H01L 23/00* (2006.01)

(52) U.S. Cl.
CPC .......... *H01L 23/585* (2013.01); *H01L 23/481* (2013.01); *H01L 24/14* (2013.01)

(58) Field of Classification Search
CPC ...... H01L 23/585; H01L 23/481; H01L 24/14
See application file for complete search history.

(56) References Cited

U.S. PATENT DOCUMENTS

| 5,424,245 | A | * | 6/1995 | Gurtler | ............. | H01L 21/76898 |
| | | | | | | 257/774 |
| 7,030,481 | B2 | * | 4/2006 | Chudzik | ................ | H01L 23/50 |
| | | | | | | 257/700 |
| 7,179,740 | B1 | * | 2/2007 | Hsuan | .................. | H01L 23/481 |
| | | | | | | 257/E23.011 |
| 7,851,893 | B2 | | 12/2010 | Kim et al. | | |
| 8,796,140 | B1 | | 8/2014 | Gu et al. | | |
| 2006/0001174 | A1 | * | 1/2006 | Matsui | .............. | H01L 21/76898 |
| | | | | | | 257/774 |
| 2007/0161235 | A1 | * | 7/2007 | Trezza | ................ | H01L 21/6835 |
| | | | | | | 438/667 |
| 2011/0241185 | A1 | | 10/2011 | Koester et al. | | |
| 2012/0013022 | A1 | * | 1/2012 | Sabuncuoglu Tezcan | ................ | |
| | | | | | | H01L 21/7682 |
| | | | | | | 257/774 |
| 2012/0248586 | A1 | * | 10/2012 | Lee | ........................ | H01L 23/481 |
| | | | | | | 257/659 |
| 2012/0267786 | A1 | * | 10/2012 | Kirby | ................ | H01L 21/76898 |
| | | | | | | 257/770 |
| 2012/0305916 | A1 | * | 12/2012 | Liu | ......................... | H01L 22/34 |
| | | | | | | 257/48 |
| 2013/0032799 | A1 | * | 2/2013 | Yen | ......................... | H01L 22/34 |
| | | | | | | 257/48 |
| 2013/0313718 | A1 | * | 11/2013 | Varghese | ................. | H01L 22/12 |
| | | | | | | 257/774 |
| 2016/0358889 | A1 | * | 12/2016 | Lai | ........................ | H01L 23/481 |
| 2017/0223825 | A1 | * | 8/2017 | Thadesar | ............. | H05K 1/0245 |

* cited by examiner

*Primary Examiner* — Benjamin Sandvik
*Assistant Examiner* — Farid Khan
(74) *Attorney, Agent, or Firm* — Muncy, Geissler, Olds & Lowe, P.C.

(57) ABSTRACT

A semiconductor structure includes a substrate including a first side and a second side opposite to the first side; a first via extending through the substrate; a second via extending through the substrate; and a metallic structure disposed between the first via and the second via, wherein the first via is isolated from the second via by the metallic structure, the first via and the second via are configured to connect to a signal source or transmit a signal, and the metallic structure is configured to connect to a power or a ground.

19 Claims, 21 Drawing Sheets

SEMICONDUCTOR STRUCTURE WITH THROUGH SUBSTRATE VIA AND MANUFACTURING METHOD THEREOF

TECHNICAL FIELD

The present disclosure relates to a semiconductor structure, and particularly relates to a shielding structure in the semiconductor structure. Further, the present disclosure relates to a method of manufacturing the semiconductor structure comprising the shielding structure.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, various types and dimensions of semiconductor devices performing different functionalities are integrated and packaged into a single module. Furthermore, numerous manufacturing operations are implemented for integration of various types of semiconductor devices.

However, the manufacturing and integration of semiconductor devices involve many complicated steps and operations. Integration of a semiconductor device having a low profile and high density becomes increasingly complicated. An increase in complexity of manufacturing and integration of the semiconductor device may cause deficiencies such as poor electrical interconnection, signal interference, delamination of the components or high yield loss. Accordingly, there is a continuous need to improve the manufacturing process of semiconductor devices and address the above complexities.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure comprising a substrate including a first side and a second side opposite to the first side; a first via extending through the substrate; a second via extending through the substrate; and a metallic structure disposed between the first via and the second via, wherein the first via is isolated from the second via by the metallic structure, the first via and the second via are configured to connect to a signal source or transmit a signal, and the metallic structure is configured to connect to a power or a ground.

In some embodiments, the semiconductor structure further comprises a dielectric liner surrounding the first via, the second via and the metallic structure.

In some embodiments, a height of the metallic structure is substantially the same as a height of the first via and a height of the second via.

In some embodiments, a width of the first via is substantially the same as a width of the second via.

In some embodiments, the metallic structure is extended through the substrate.

In some embodiments, the semiconductor structure further comprises a first dielectric layer and a first metallic member, wherein the first dielectric layer is disposed over the first side of the substrate, and the first metallic member is disposed within the first dielectric layer and electrically connected to the first via, the second via or the metallic structure.

In some embodiments, the first metallic member includes a pad partially exposed from the first dielectric layer.

In some embodiments, a portion of the first via, a portion of the second via and a portion of the metallic structure are disposed within the first dielectric layer.

In some embodiments, the semiconductor structure further comprises a second dielectric layer and a second metallic member, wherein the second dielectric layer is disposed over the second side of the substrate, and the second metallic member is disposed within the second dielectric layer and electrically connected to the first via and the second via.

In some embodiments, the semiconductor structure further comprises a conductive bump disposed over and electrically connected to the second metallic member.

In some embodiments, the semiconductor structure further comprises a conductive bump disposed over the second side of the substrate and electrically connected to the first via and the second via.

Another aspect of the present disclosure provides a method of manufacturing a semiconductor structure comprising providing a substrate including a first side and a second side opposite to the first side; forming a first via, a second via and a metallic structure extending from the first side of the substrate towards the second side of the substrate; disposing a dielectric layer over the first side of the substrate; and forming a metallic member within the dielectric layer and over the first via, the second via or the metallic structure, wherein the metallic structure is disposed between the first via and the second via, the first via and the second via are configured to connect to a signal source or transmit a signal, and the metallic structure is configured to connect to a power or a ground.

In some embodiments, the forming of the first via, the second via and the metallic structure includes removing a portion of the substrate to form a recess and disposing a conductive material within the recess.

In some embodiments, the method further comprises disposing a dielectric liner conformal to the recess.

In some embodiments, the first via, the second via and the metallic structure are formed simultaneously.

In some embodiments, the forming of the metallic member includes forming a pad partially exposed from the dielectric layer and disposed over the first via, the second via or the metallic structure.

In some embodiments, the metallic member is electrically connected to the first via, the second via or the metallic structure.

In some embodiments, a third dielectric layer is disposed over the first side of the substrate prior to the formation of the first via, the second via and the metallic structure.

In some embodiments, the method further comprises grinding the second side of the substrate to expose a portion of the first via and a portion of the second via from the substrate.

In some embodiments, the method further comprises disposing a conductive bump over and electrically connected to the first via and the second via.

The foregoing has outlined rather broadly the features and technical advantages of the present disclosure in order that the detailed description of the disclosure that follows may be better understood.

Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
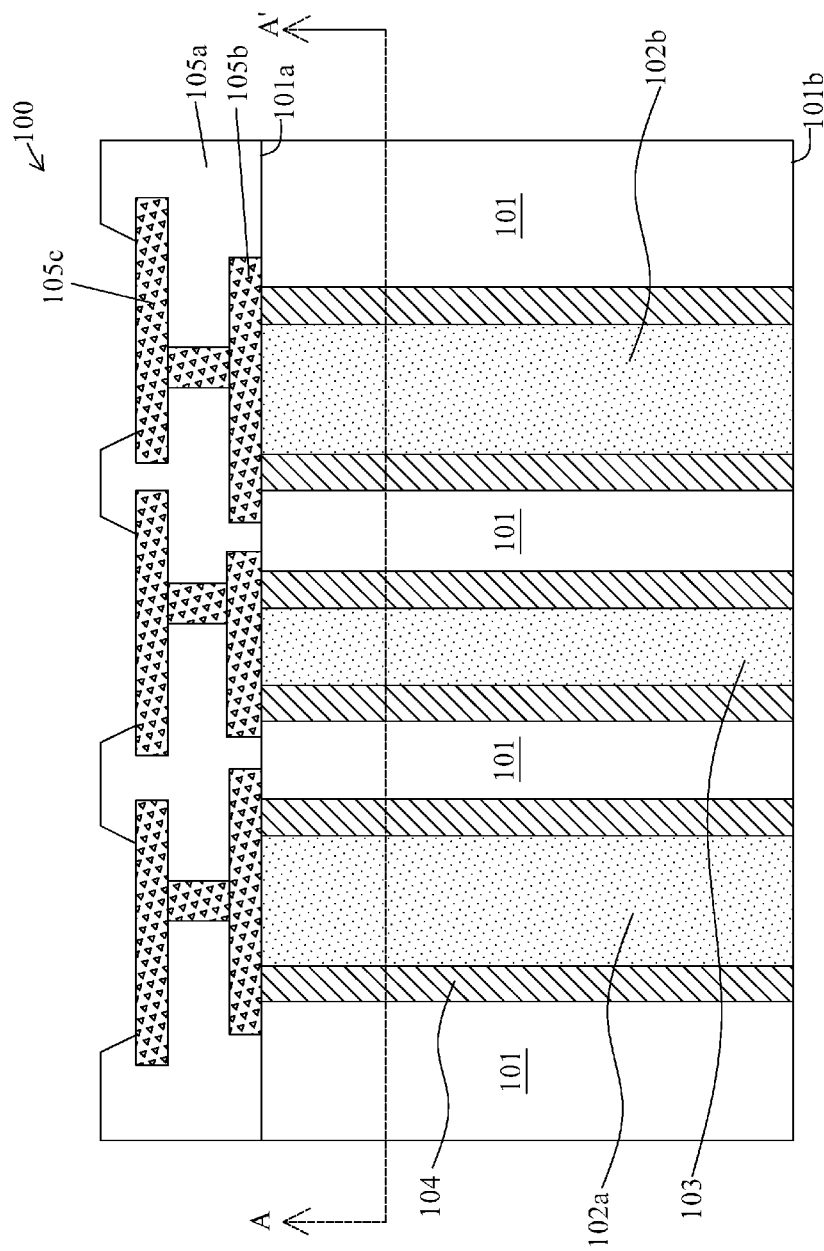
FIG. 1 is a schematic cross-sectional view of a semiconductor structure in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor structure comprising a metallic structure disposed between two adjacent vias. The vias are electrically connected to a signal or a signal source, while the metallic structure is electrically connected to a power or a ground. Also, the present disclosure is directed to a method of manufacturing a semiconductor structure comprising forming at least two vias and a metallic structure between the vias. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

An electronic device including various semiconductor devices is manufactured by a number of operations. During the manufacturing, the semiconductor devices with different functionalities and dimensions are integrated into a single system. Circuitries of the semiconductor devices are integrated and connected through conductive traces and a substrate. After integration of the semiconductor devices, the semiconductor devices are encapsulated by a mold in order to protect the semiconductor devices from damage to the circuitries and from environmental contamination. However, in some cases, the encapsulation of the semiconductor devices cannot be formed in a desired configuration. As a result, contamination of the semiconductor devices and delamination of components may occur.

A semiconductor structure may include some vias for signal transmission while preventing leakage or crosstalk of signals. The vias require isolation from electromagnetic interference from adjacent vias. A shielding is provided for isolating the vias and for preventing interference and signal leakage.

In the present disclosure, a semiconductor structure is disclosed. The semiconductor structure comprises a substrate, a first via extending through the substrate, a second via extending through the substrate, and a metallic structure disposed between the first via and the second via and extending through the substrate. The first via and the second via are configured to connect to a signal source or transmit a signal, while the metallic structure is configured to connect to a power or a ground. As such, the first via is isolated from the second via by the metallic structure, and thus crosstalk between the first via and the second via is prevented or minimized. As a result, speed of signal transmission by vias can be increased.

FIG. 1 is a cross-sectional view of a semiconductor structure 100 in accordance with some embodiments of the present disclosure. In some embodiments, the semiconductor structure 100 includes a substrate 101, a first via 102a, a second via 102b and a metallic structure 103 disposed between the vias 102.

In some embodiments, the semiconductor structure 100 is a part of a die, a chip or a semiconductor package. In some embodiments, the semiconductor structure 100 is a die, a chip or a semiconductor package.

In some embodiments, the substrate 101 is a semiconductive substrate. In some embodiments, the substrate 101 is a wafer. In some embodiments, the substrate 101 includes semiconductive material such as silicon, germanium, gallium, arsenic, or combinations thereof. In some embodiments, the substrate 101 is a silicon substrate. In some embodiments, the substrate 101 includes material such as ceramic, glass or the like. In some embodiments, the substrate 101 includes organic material. In some embodiments, the substrate 101 is a glass substrate. In some embodiments, the substrate 101 is a packaging substrate. In some embodiments, the substrate 101 has a quadrilateral, rectangular, square, polygonal or any other suitable shape.

In some embodiments, the substrate 101 is fabricated with a predetermined functional circuit thereon. In some embodiments, the substrate 101 includes several conductive traces and several electrical components such as transistor, diode, etc. disposed within the substrate 101a.

In some embodiments, the substrate 101a includes a first side 101a and a second side 101b opposite to the first side 101a. In some embodiments, the first side 101a is a front side or an active side where the circuits or electrical components are disposed thereon. In some embodiments, a device is disposed over the first side 101a of the substrate 101. In some embodiments, the second side 101b is a back side or an inactive side.

In some embodiments, the first via 102a extends through the substrate 101. In some embodiments, the first via 102a extends between the first side 101a and the second side 101b of the substrate 101. In some embodiments, a portion of the first via 102a is exposed from the second side 101b of the substrate 101. In some embodiments, the first via 102a is conductive or includes conductive material such as copper, aluminum, or silver. In some embodiments, the first via 102a is a through substrate via or through silicon via (TSV).

In some embodiments, the second via 102b extends through the substrate 101. In some embodiments, the second via 102b extends between the first side 101a and the second side 101b of the substrate 101. In some embodiments, a portion of the second via 102b is exposed from the second side 101b of the substrate 101. In some embodiments, the second via 102b is conductive or includes conductive material such as copper, aluminum, or silver. In some embodiments, the second via 102b is a through substrate via or through silicon via (TSV). In some embodiments, the second via 102b has a configuration similar to that of the first via 102a.

In some embodiments, the metallic structure 103 is disposed between the first via 102a and the second via 102b. In some embodiments, the metallic structure 103 is extended between the first side 101a and the second side 101b of the substrate 101. In some embodiments, the metallic structure 103 is not extended through the substrate 101. In some embodiments, the metallic structure 103 is not exposed from the second side 101b of the substrate 101. In some embodiments, the metallic structure 103 extends through the substrate 101. In some embodiments, the metallic structure 103 extends between the first side 101a and the second side 101b of the substrate 101. In some embodiments, the metallic structure 103 is conductive or includes conductive material such as copper, aluminum, or silver. In some embodiments, the metallic structure 103 has a configuration similar to that of the first via 102a or the second via 102b. In some embodiments, the metallic structure 103 is a TSV.

In some embodiments, a height of the first via 102a is substantially equal to a height of the second via 102b. In some embodiments, a height of the metallic structure 103 is substantially equal to the height of the first via 102a or the height of the second via 102b. In some embodiments, a height of the metallic structure 103 is substantially shorter than the height of the first via 102a or the height of the second via 102b.

In some embodiments, the first via 102a and the second via 102b are configured to connect to a signal source or transmit a signal. In some embodiments, a signal can be transmitted through the first via 102a or the second via 102b. In some embodiments, the metallic structure 103 is configured for shielding. In some embodiments, the metallic structure 103 is configured to connect to a power or a ground. In some embodiments, the first via 102a is isolated from the second via 102b by the metallic structure 103. In some embodiments, the metallic structure 103 disposed between the first via 102a and the second via 102b can prevent signal crosstalk between the first via 102a and the second via 102b, such that a speed of signal transmission by the first via 102a or the second via 102b can be increased.

In some embodiments, a dielectric liner 104 is disposed within the substrate 101 and surrounds the first via 102a, the second via 102b and the metallic structure 103. In some embodiments, the dielectric liner 104 is disposed between the substrate 101 and the first via 102a. In some embodiments, the dielectric liner 104 is disposed between the substrate 101 and the second via 102b. In some embodiments, the dielectric liner 104 is disposed between the substrate 101 and the metallic structure 103. In some embodiments, the dielectric liner 104 includes polyimide, polymer, resin, oxide or the like.

In some embodiments, a first redistribution layer (RDL) 105 is disposed over the substrate 101. In some embodiments, the first RDL 105 is disposed over the first side 101a of the substrate 101. In some embodiments, the RDL 105 re-routes a path of a circuit from the first via 102a, the second via 102b or the metallic structure 103 to a circuitry external to the substrate 101. In some embodiments, the RDL 105 is a post passivation interconnect (PPI).

In some embodiments, the first RDL 105 includes a first dielectric layer 105a and a first metallic member 105b disposed within the first dielectric layer 105a. In some embodiments, the first dielectric layer 105a is disposed over the first side 101a of the substrate 101. In some embodiments, the first dielectric layer 105a includes dielectric materials, such as oxide, nitride, polymer or the like.

In some embodiments, the first metallic member 105b is surrounded by the first dielectric layer 105a. In some embodiments, the first metallic member 105b is disposed over the first via 102a, the second via 102b or the metallic structure 103. In some embodiments, the first metallic member 105b is electrically connected to the first via 102a, the second via 102b or the metallic structure 103. In some embodiments, the first metallic member 105b covers the dielectric liner 104. In some embodiments, the first metallic member 105b includes conductive material such as gold, silver, copper, nickel, tungsten, aluminum, palladium or alloys thereof.

In some embodiments, the first metallic member 105b is partially exposed from the first dielectric layer 105a. In some embodiments, the first metallic member 105b includes a pad 105c partially exposed from the first dielectric layer 105a. In some embodiments, the pad 105c is configured to receive or electrically connect to an external circuit or external conductive structure. In some embodiments, the pad 105c is an output terminal.

Figure 2:
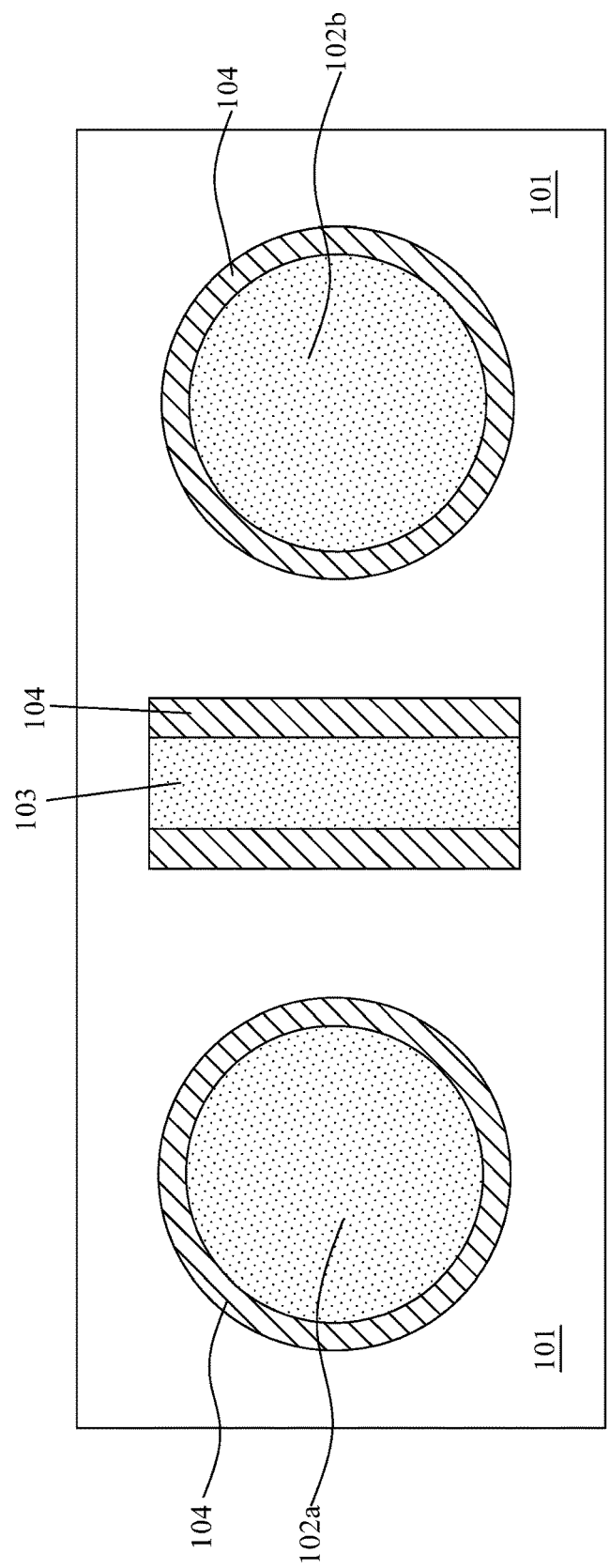
FIG. 2 is a schematic top cross-sectional view of a semiconductor structure in accordance with some embodiments of the present disclosure.

FIG. 2 is a top cross-sectional view of the semiconductor structure 100 along AA'. In some embodiments, a top cross section of the first via 102a is of a circular, quadrilateral or polygonal shape. In some embodiments, a top cross section of the second via 102b is of a circular, quadrilateral or polygonal shape. In some embodiments, the top cross section of the first via 102a and the top cross section of the second via 102b have similar shapes. In some embodiments, a top cross section of the metallic structure 103 is of a rectangular, quadrilateral, circular or polygonal shape. In some embodiments, the top cross section of the metallic structure 103 has a different shape than the top cross section of the first via 102a or the top cross section of the second via 102b.

In some embodiments, a width of the first via 102a is substantially the same as a width of the second via 102b. In some embodiments, a diameter of the first via 102a is substantially the same as a diameter of the second via 102b. In some embodiments, a longest length of the metallic structure 103 is substantially greater than or equal to the width of the first via 102a. In some embodiments, the longest length of the metallic structure 103 is substantially greater than or equal to the width of the second via 102b.

Figure 3:
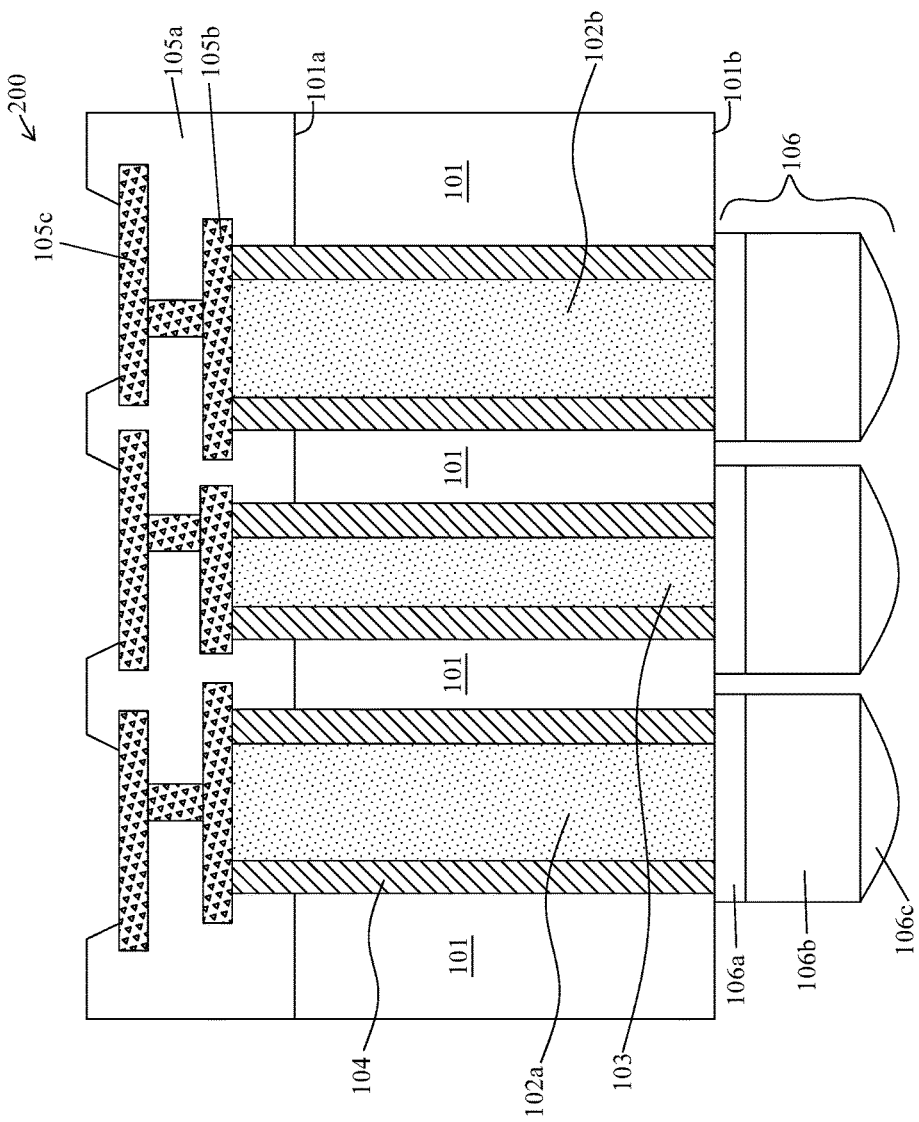
FIG. 3 is a schematic cross-sectional view of a semiconductor structure in accordance with some embodiments of the present disclosure.

FIG. 3 is a cross-sectional view of a semiconductor structure 200 in accordance with some embodiments of the present disclosure. In some embodiments, the semiconductor structure 200 has a configuration similar to that of the semiconductor structure 100. In some embodiments, the semiconductor structure 200 includes a substrate 101, a first via 102a, a second via 102b and a metallic structure 103, which have configurations similar to those described above or illustrated in FIG. 1 or 2.

In some embodiments, the semiconductor structure 200 includes a conductive bump 106 disposed over the substrate 101. In some embodiments, the conductive bump 106 is disposed over the second side 101b of the substrate 101. In some embodiments, the conductive bump 106 is electrically connected to the first via 102a and the second via 102b. In some embodiments, the conductive bump 106 is not electrically connected to the metallic structure 103. In some embodiments, the conductive bump 106 includes conductive material such as solder, copper, nickel, or gold. In some embodiments, the conductive bump 106 is a solder ball, a ball grid array (BGA) ball, a controlled collapse chip connection (C4) bump, a microbump, a pillar or the like. In some embodiments, the conductive bump 106 has a spherical, hemispherical or cylindrical shape.

In some embodiments, the conductive bump 106 includes a bond pad portion 106a, a body portion 106b and a soldering portion 106c. In some embodiments, the bond pad portion 106a is disposed over or coupled with the first via 102, the second via 102b or the metallic structure 103. In some embodiments, the bond pad portion 106a is configured to bond the body portion 106b over the first via 102, the second via 102b or the metallic structure 103. In some embodiments, the body portion 106b extends from the bond pad portion 106a and away from the first via 102, the second via 102b or the metallic structure 103. In some embodiments, the soldering portion 106c is disposed over the body portion 106b. In some embodiments, the soldering portion 106c is configured to join with an external conductive structure.

Figure 4:
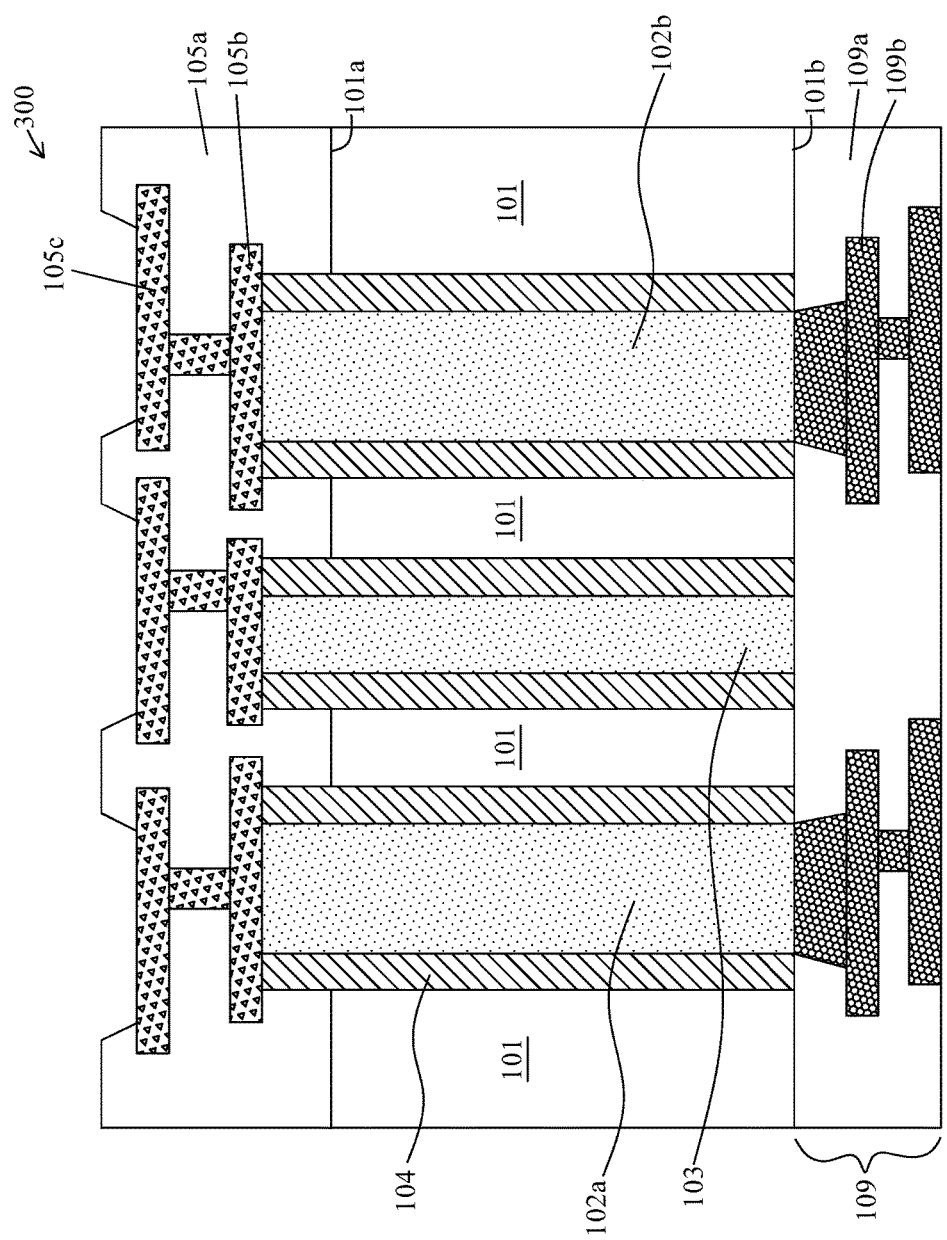
FIG. 4 is a schematic cross-sectional view of a semiconductor structure in accordance with some embodiments of the present disclosure.

FIG. 4 is a cross-sectional view of a semiconductor structure 300 in accordance with some embodiments of the present disclosure. In some embodiments, the semiconductor structure 300 has a configuration similar to that of the semiconductor structure 100. In some embodiments, the semiconductor structure 300 includes a substrate 101, a first via 102a, a second via 102b and a metallic structure 103, which have configurations similar to those described above or illustrated in FIG. 1 or 2.

In some embodiments, a second RDL 109 is disposed over the substrate 101. In some embodiments, the second RDL 109 is disposed over the second side 101b of the substrate 101. In some embodiments, the second RDL 109 includes a second dielectric layer 109a and a second metallic member 109b disposed within the second dielectric layer 109a. In some embodiments, the second dielectric layer 109a is disposed over the second side 101b of the substrate 101. In some embodiments, the second dielectric layer 109a includes dielectric materials, such as oxide, nitride, polymer or the like.

In some embodiments, the second metallic member 109b is surrounded by the second dielectric layer 109a. In some embodiments, the second metallic member 109b is disposed over the first via 102a and the second via 102b. In some embodiments, the second metallic member 109b is not electrically connected to the metallic structure 103. In some embodiments, the second metallic member 109b is electrically connected to the first via 102a and the second via 102b. In some embodiments, the second metallic member 109b includes conductive material such as gold, silver, copper, nickel, tungsten, aluminum, palladium or alloys thereof. In some embodiments, a conductive bump 106 is disposed over and electrically connected to the second metallic member 109b.

In some embodiments, a portion of the first via 102a, a portion of the second via 102b and a portion of the metallic structure 103 are disposed within the first dielectric layer 105a. In some embodiments, the portion of the first via 102a, the portion of the second via 102b and the portion of the metallic structure 103 are protruded from the first side 101a of the substrate 101 to the first dielectric layer 105a. In some embodiments, a portion of the dielectric liner 104 is disposed within the first dielectric layer 105a.

Figure 5:
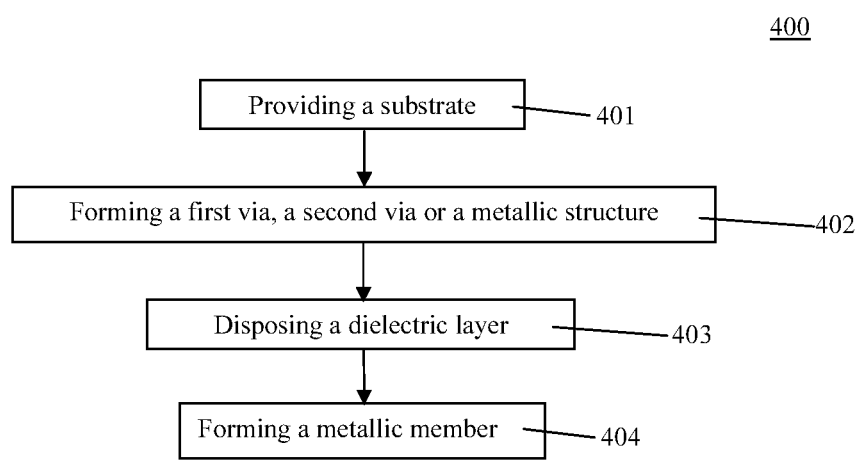
FIG. 5 is a flow chart of a method of manufacturing a semiconductor structure in accordance with some embodiments of the present disclosure.

In the present disclosure, a method of manufacturing a semiconductor structure is also disclosed. In some embodiments, the semiconductor structure can be formed by a method 400 as shown in FIG. 5. The method 400 includes a number of operations and the description and illustration are not deemed as a limitation to the sequence of the operations. The method 400 includes a number of steps (401, 402, 403 and 404).

Figure 6:
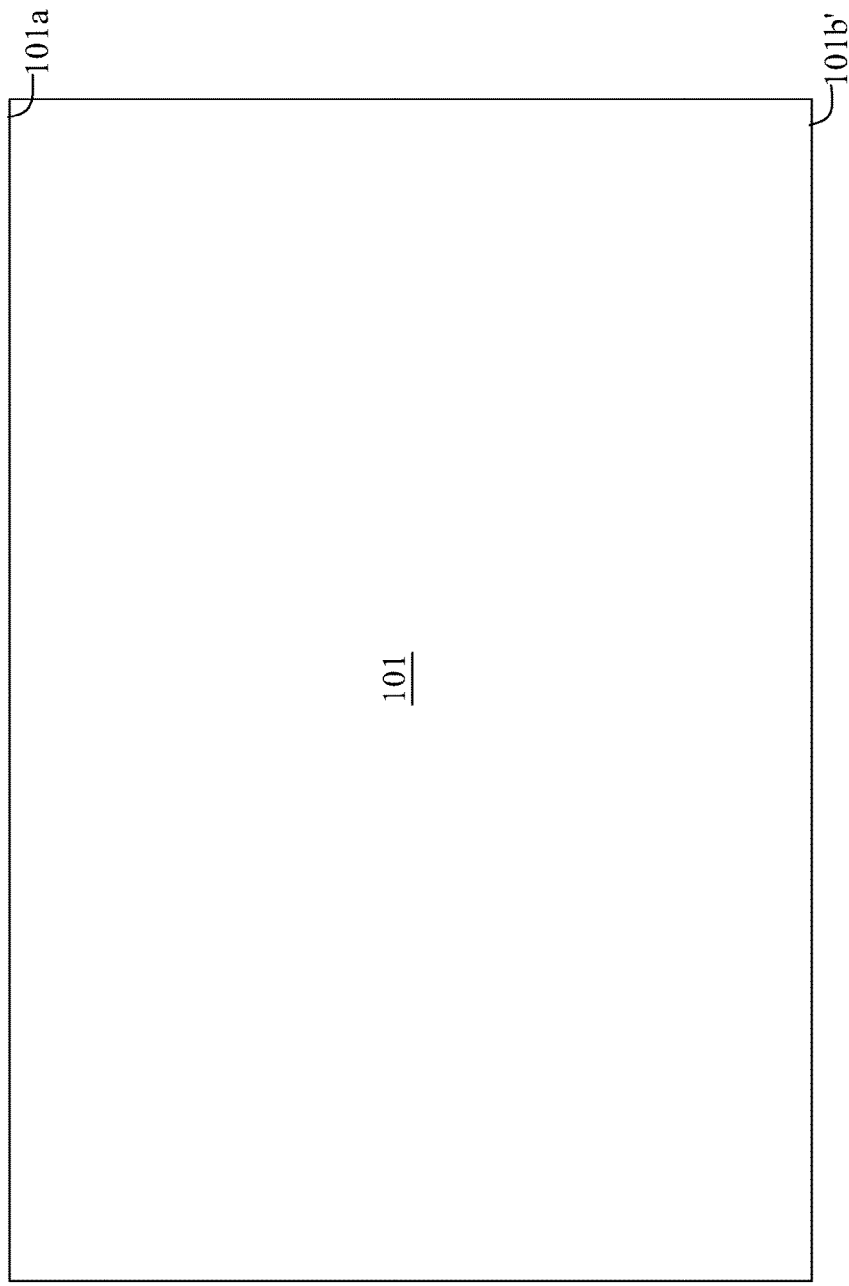
FIGS. 6 to 21 are schematic views illustrating a process of manufacturing the semiconductor structure by the method of FIG. 5 in accordance with some embodiments of the present disclosure.

In step 401, a substrate 101 is provided as shown in FIG. 6. In some embodiments, the substrate 101 is a semiconductive substrate. In some embodiments, the substrate 101 is a wafer. In some embodiments, the substrate 101 includes semiconductive material such as silicon, germanium, gallium, arsenic, or combinations thereof. In some embodiments, the substrate 101 is a silicon substrate. In some embodiments, the substrate 101 has a configuration similar to those described above or illustrated in any one of FIGS. 1 to 4.

In some embodiments, the substrate 101 includes a first side 101a and a second side 101b' opposite to the first side 101a. In some embodiments, the first side 101a is an active side. In some embodiments, a device is disposed over the first side 101a of the substrate 101. In some embodiments, the second side 101b is an inactive side.

Figure 7:
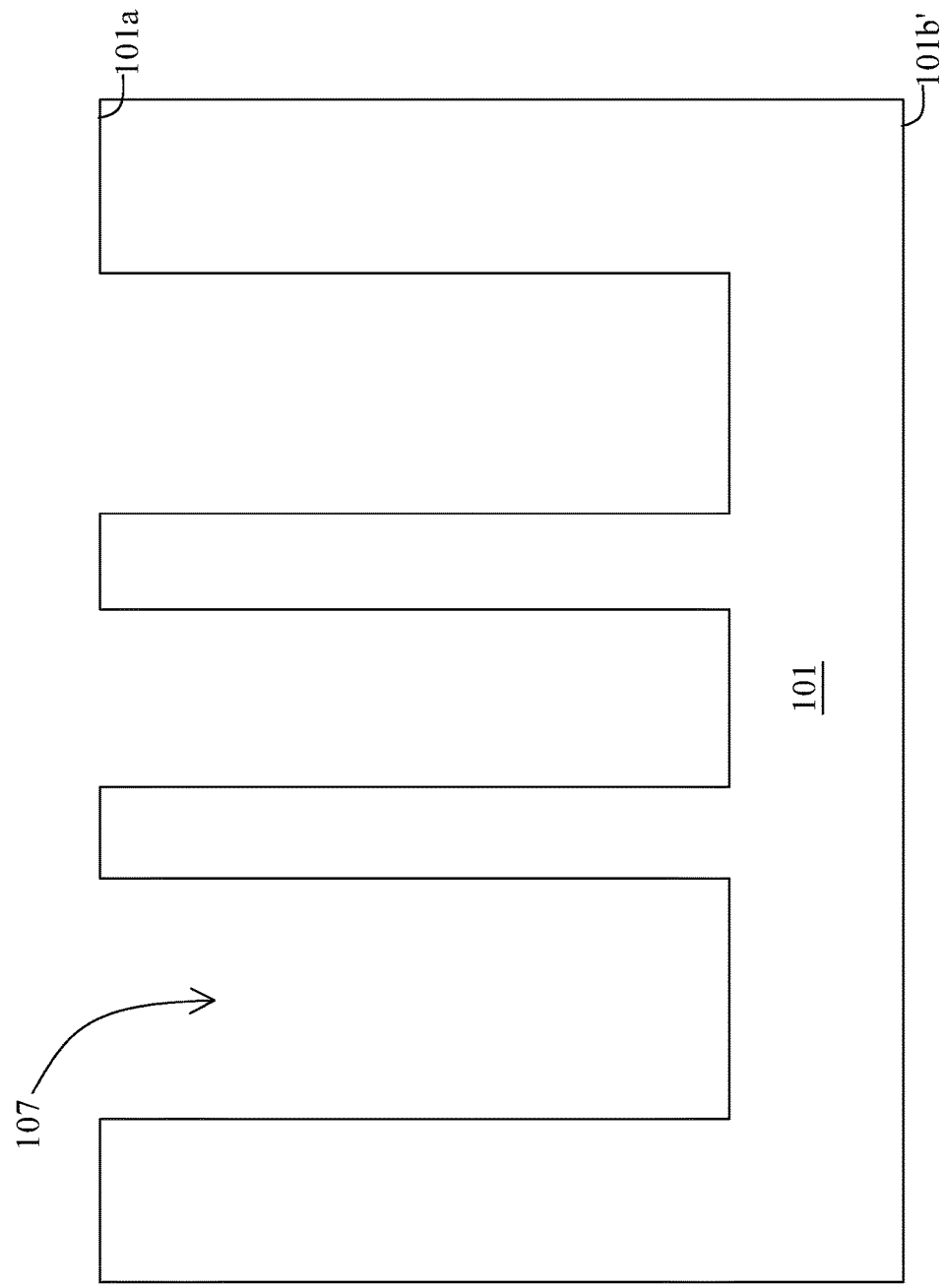
Figure 8:
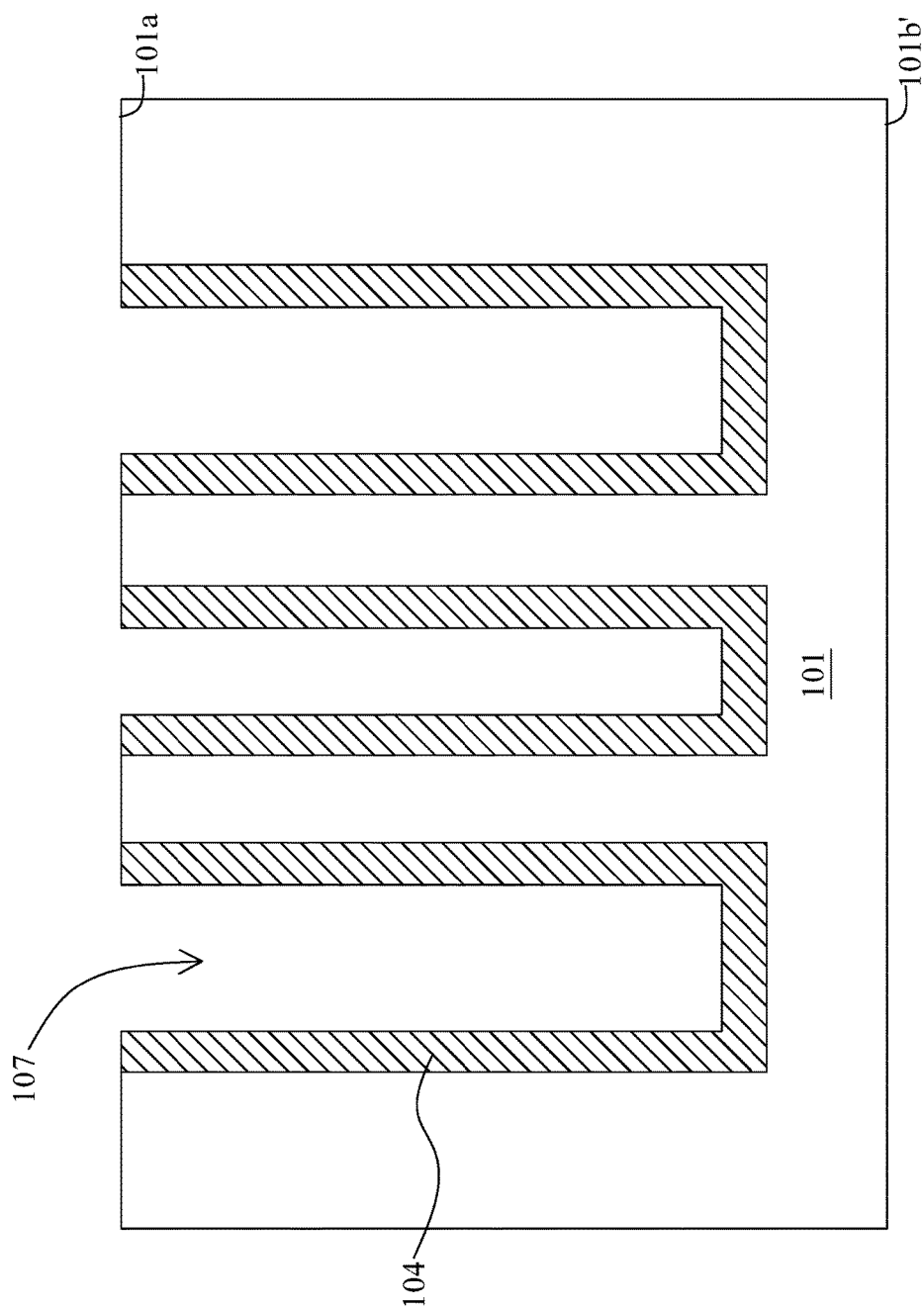
Figure 9:
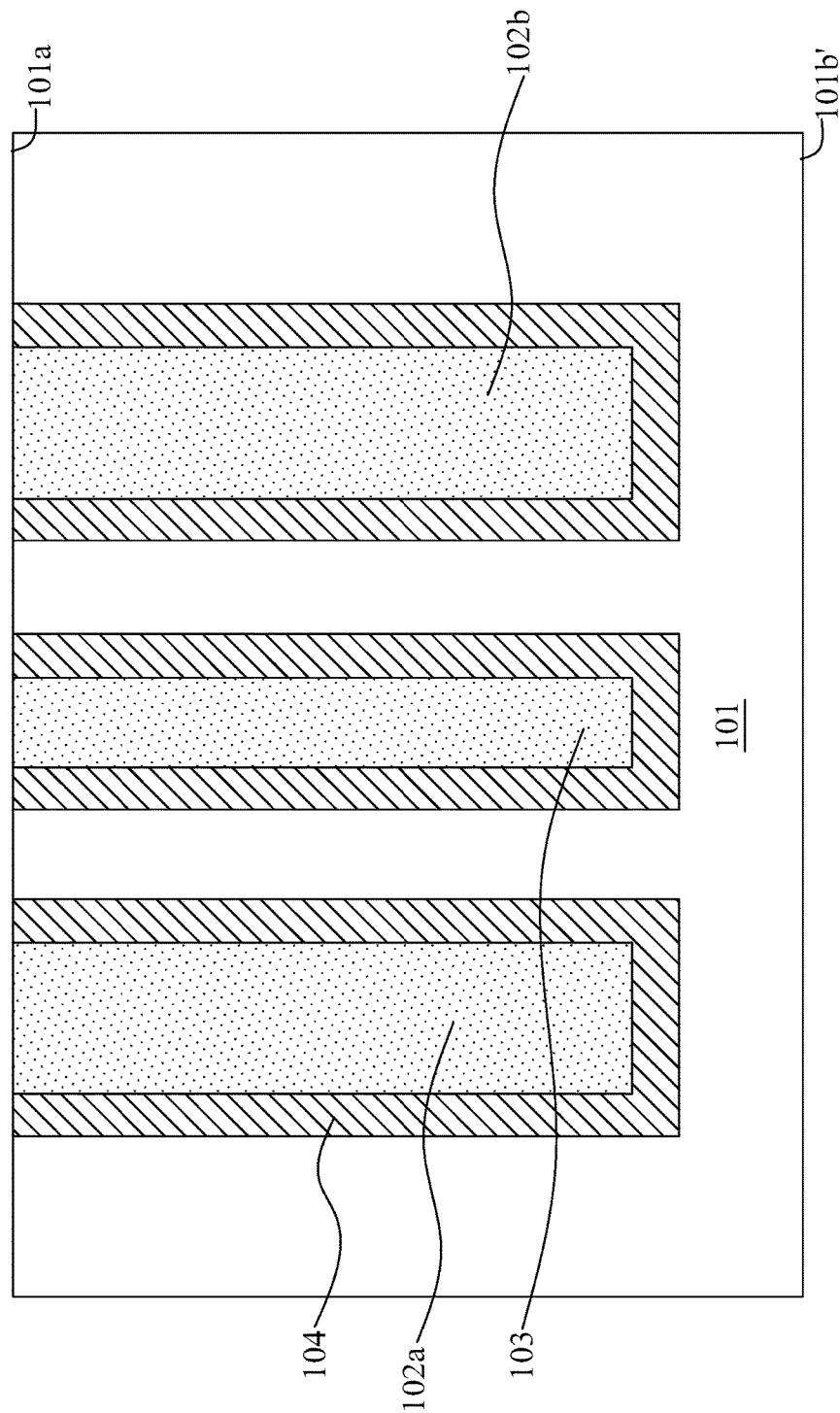

In step 402, a first via 102a, a second via 102b and a metallic structure 103 are formed as shown in FIGS. 7 to 9. In some embodiments, the first via 102a, the second via 102b and the metallic structure 103 are formed separately or simultaneously. In some embodiments, the first via 102a, the second via 102b and the metallic structure 103 are formed by removing several portions of the substrate 101 to form several recesses 107 as shown in FIG. 7. In some embodiments, the portions of the substrate 101 are removed by any suitable operations such as etching, laser drilling, etc. In some embodiments, the recess 107 extends from the first side 101a of the substrate 101 towards the second side 101b' of the substrate 101.

In some embodiments, a dielectric liner 104 is disposed conformal to the recess 107 as shown in FIG. 8. In some embodiments, the dielectric liner is disposed along a sidewall of the recess 107. In some embodiments, the dielectric liner 104 is disposed by deposition, spin coating or any other suitable operation. In some embodiments, the dielectric liner 104 includes polyimide, polymer, resin, oxide or the like. In some embodiments, the dielectric liner 104 has a configuration similar to those described above or illustrated in any one of FIGS. 1 to 4.

In some embodiments, a conductive material is disposed within the recess 107 to form the first via 102a, the second via 102b and the metallic structure 103 as shown in FIG. 9. In some embodiments, the conductive material is disposed by any suitable operations such as electroplating, sputtering, etc. In some embodiments, the conductive material includes gold, silver, copper, nickel, tungsten, aluminum, palladium or alloys thereof. In some embodiments, the first via 102a, the second via 102b and the metallic structure 103 extending from the first side 101a towards the second side 101b' are formed. In some embodiments, the metallic structure 103 is disposed between the first via 102a and the second via 102b.

Figure 10:
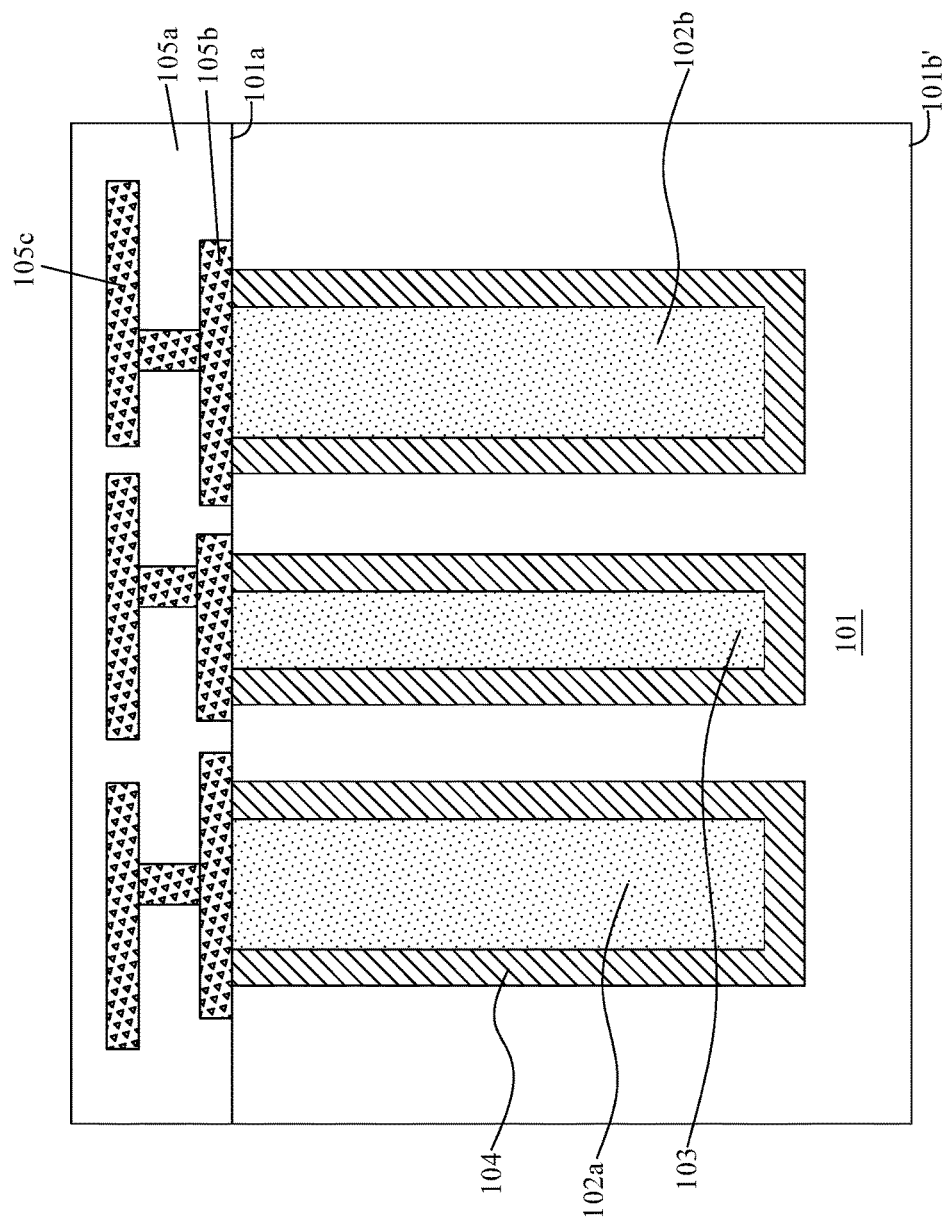

In step 403, a first dielectric layer 105a is disposed over the substrate 101 as shown in FIG. 10. In some embodiments, the first dielectric layer 105a is disposed over the first side 101a of the substrate 101. In some embodiments, the first dielectric layer 105a is disposed over the first side 101a of the substrate 101, the first via 102a, the second via 102b and the metallic structure 103 by any suitable operation such as deposition, spin coating, etc. In some embodiments, the first dielectric layer 105a includes oxide, nitride, polymer or the like. In some embodiments, the first dielectric layer 105a has a configuration similar to those described above or illustrated in any one of FIGS. 1 to 4.

In step 404, a first metallic member 105b is formed within the first dielectric layer and over the first via 102a, the second via 102b or the metallic structure 103 as shown in FIG. 10. In some embodiments, the first metallic member 105b is formed by any suitable operation such as photolithography, etching, electroplating, etc. In some embodiments, the first metallic member 105b is electrically connected to the first via 102a, the second via 102b or the metallic structure 103. In some embodiments, the first metallic member 105b includes conductive material such as gold, silver, copper, nickel, tungsten, aluminum, palladium or alloys thereof.

Figure 11:
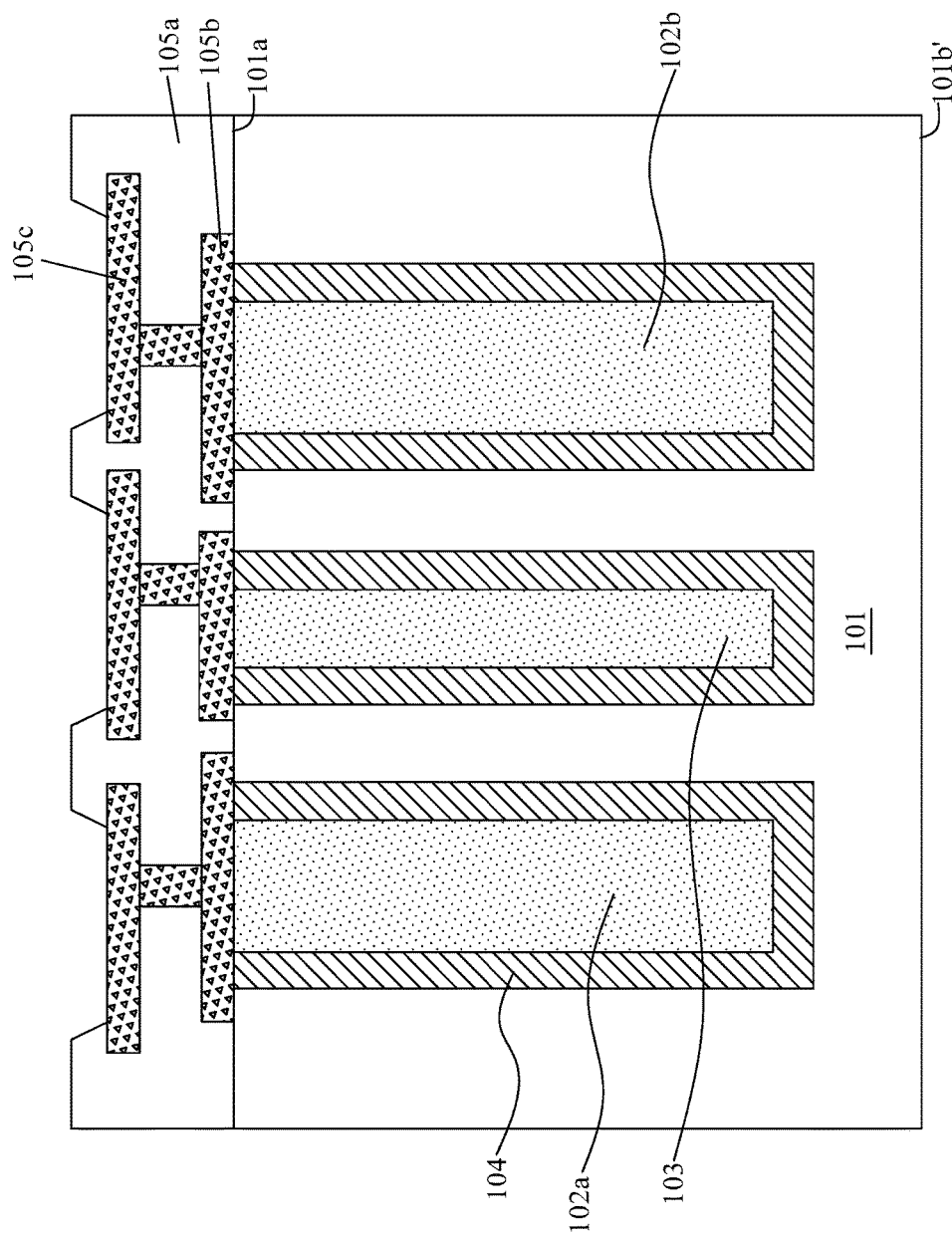

In some embodiments, the formation of the first metallic member 105b includes forming a pad 105c disposed over the first via 102a, the second via 102b or the metallic structure 103 as shown in FIG. 11. In some embodiments, the first metallic member 105b includes the pad 105c at least partially exposed from the first dielectric layer 105a. In some embodiments, a portion of the first dielectric layer 105a is removed to at least partially expose the pad 105c. In some embodiments, the portion of the first dielectric layer 105a is removed by any suitable operation, such as etching.

Figure 12:
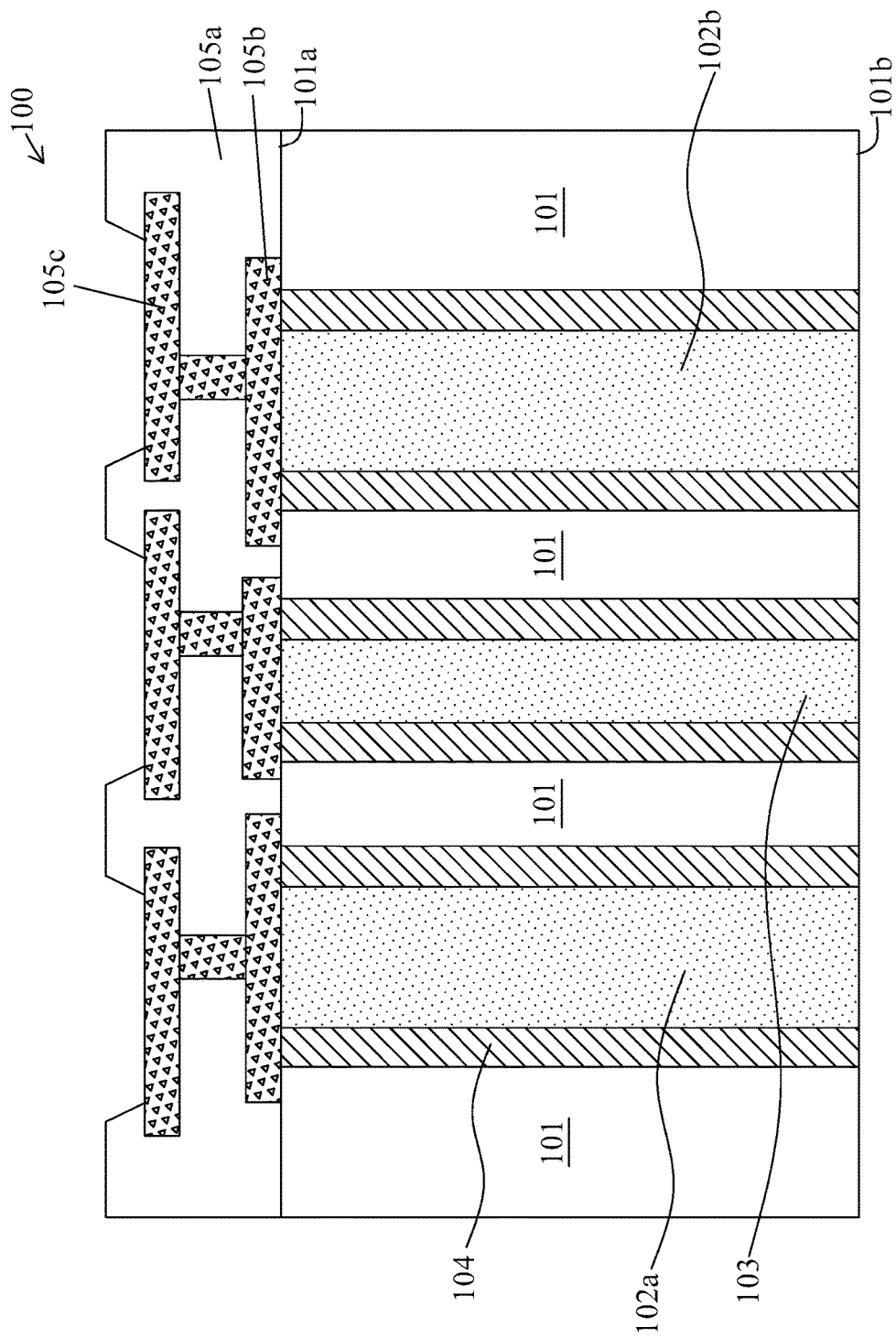

In some embodiments, the substrate 101 is thinned down as shown in FIG. 12. In some embodiments, a thickness of the substrate 101 is reduced by removing some portions of the substrate 101 from the second side 101b' of the substrate 101. In some embodiments, the second side 101b' of the substrate 101 becomes a second side 101b of the substrate 101 after reducing the thickness of the substrate 101. In some embodiments, the substrate 101 is thinned down by grinding, etching or any other suitable operation. In some embodiments, the second side 101b' is ground to expose a portion of the first via 102a, a portion of the second via 102b and a portion of the metallic structure 103 from the substrate 101. In some embodiments, a semiconductor structure 100 is formed, which has a configuration similar to those described above or illustrated in FIG. 1 or 2.

Figure 13:
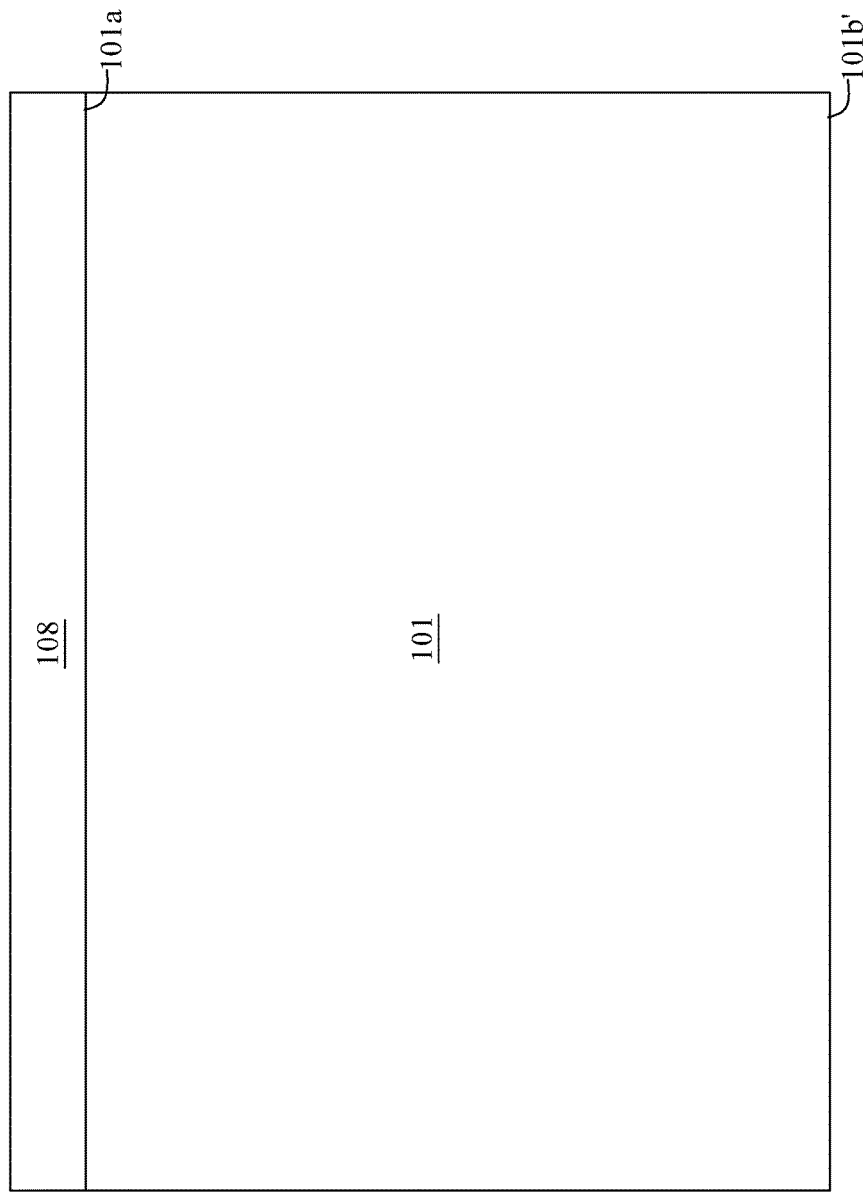

In some embodiments of the step 401, the substrate 101 including a third dielectric layer 108 disposed over the first side 101a is provided as shown in FIG. 13. In some embodiments, the third dielectric layer 108 is disposed before the formation of the first via 102a, the second via 102b and the metallic structure 103 (the step 402).

Figure 14:
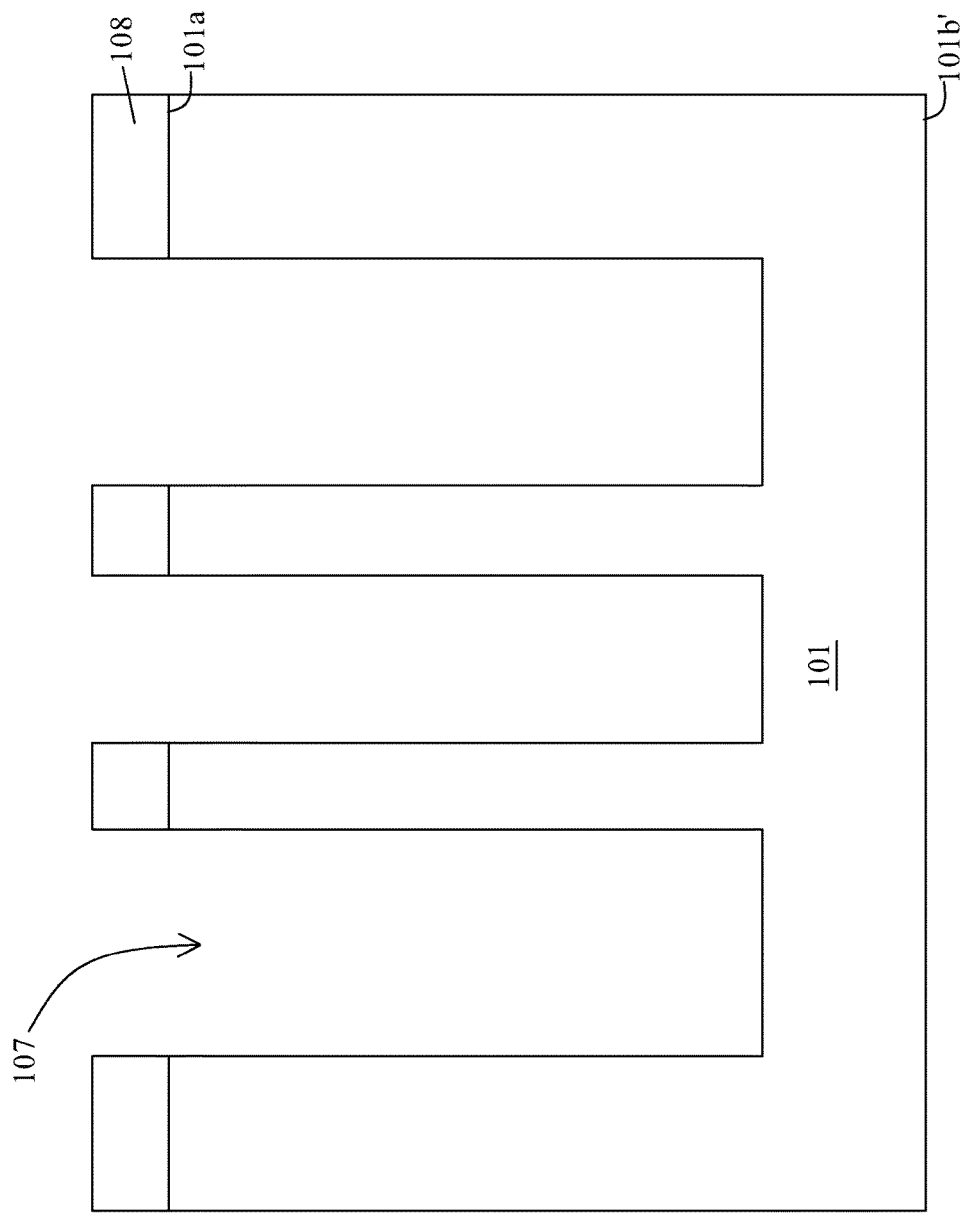
Figure 15:
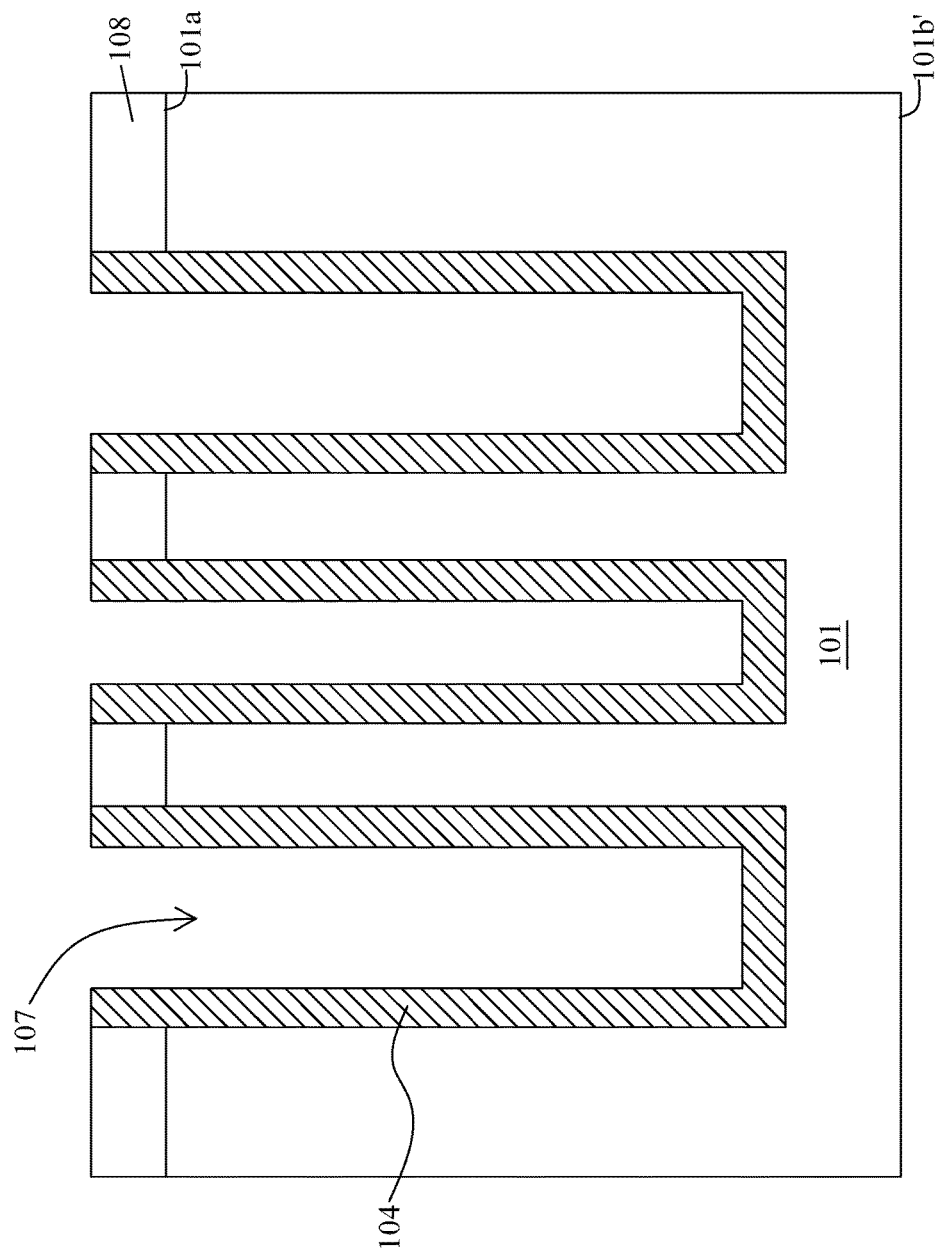
Figure 16:
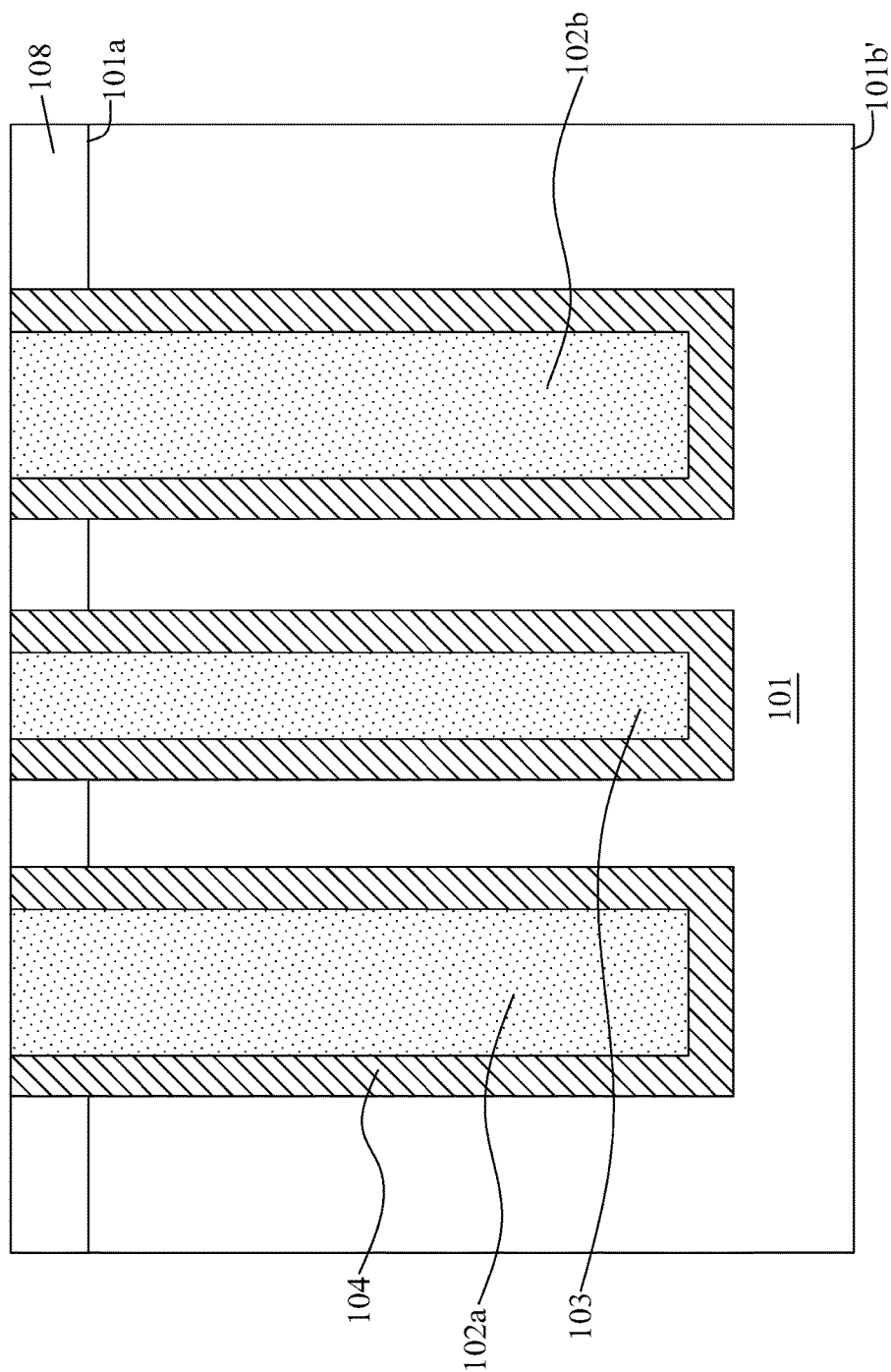

In some embodiments of the step 402, the first via 102a, the second via 102b and the metallic structure 103 extending through the third dielectric layer 108 from the first side 101a towards the second side 101b are formed as shown in FIGS. 14 to 16.

In some embodiments, the recess 107 extending through the third dielectric layer 108 from the first side 101a towards the second side 101b is formed as shown in FIG. 14. In some embodiments, the recess 107 has a configuration similar to those described above or illustrated in FIG. 7. In some embodiments, the dielectric liner 104 is disposed conformal to the recess 107 as shown in FIG. 15, which is similar to FIG. 8. In some embodiments, the conductive material is disposed within the recess 107 as shown in FIG. 16, which is similar to FIG. 9. In some embodiments, a portion of the first via 102a, a portion of the second via 102b and a portion of the metallic structure 103 are surrounded by the third dielectric layer 108.

Figure 17:
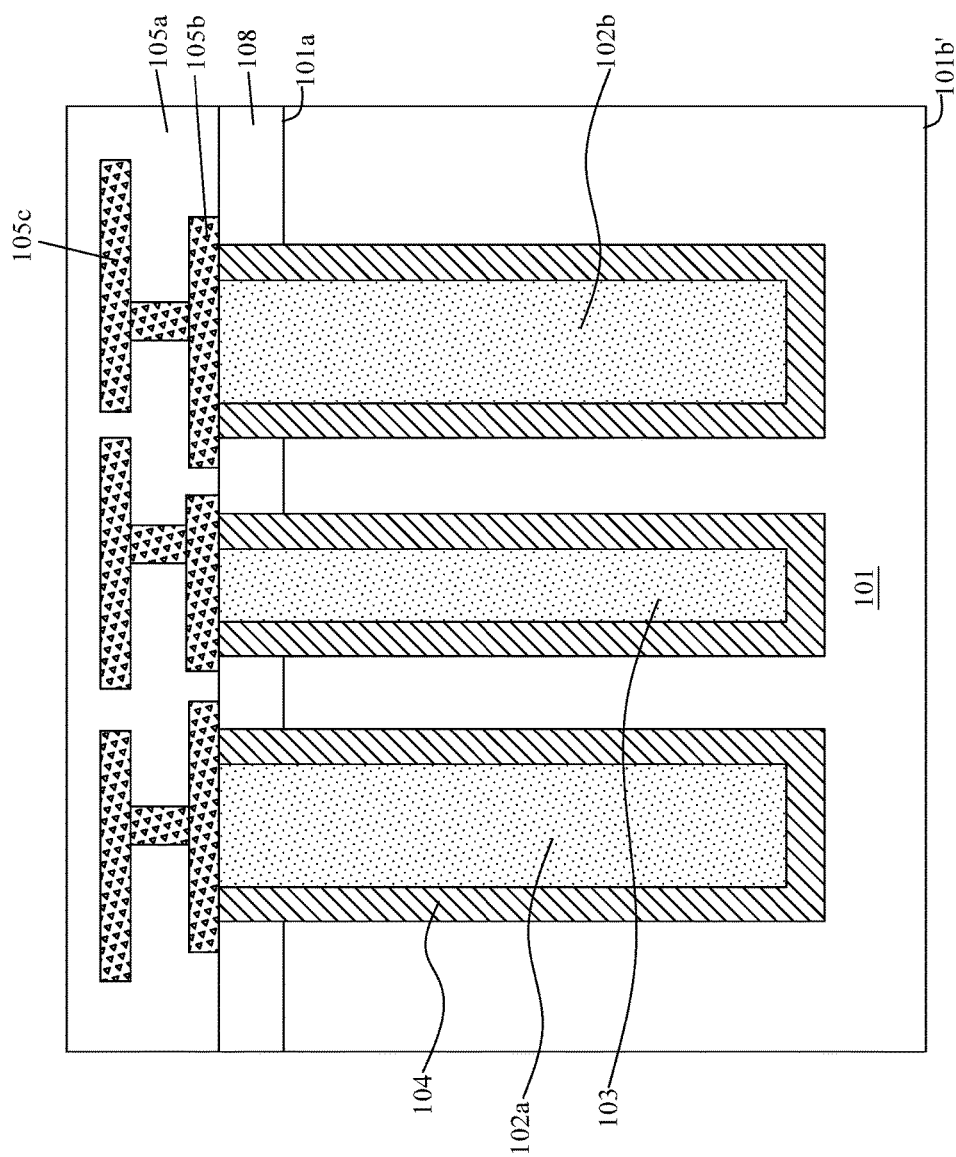
Figure 18:
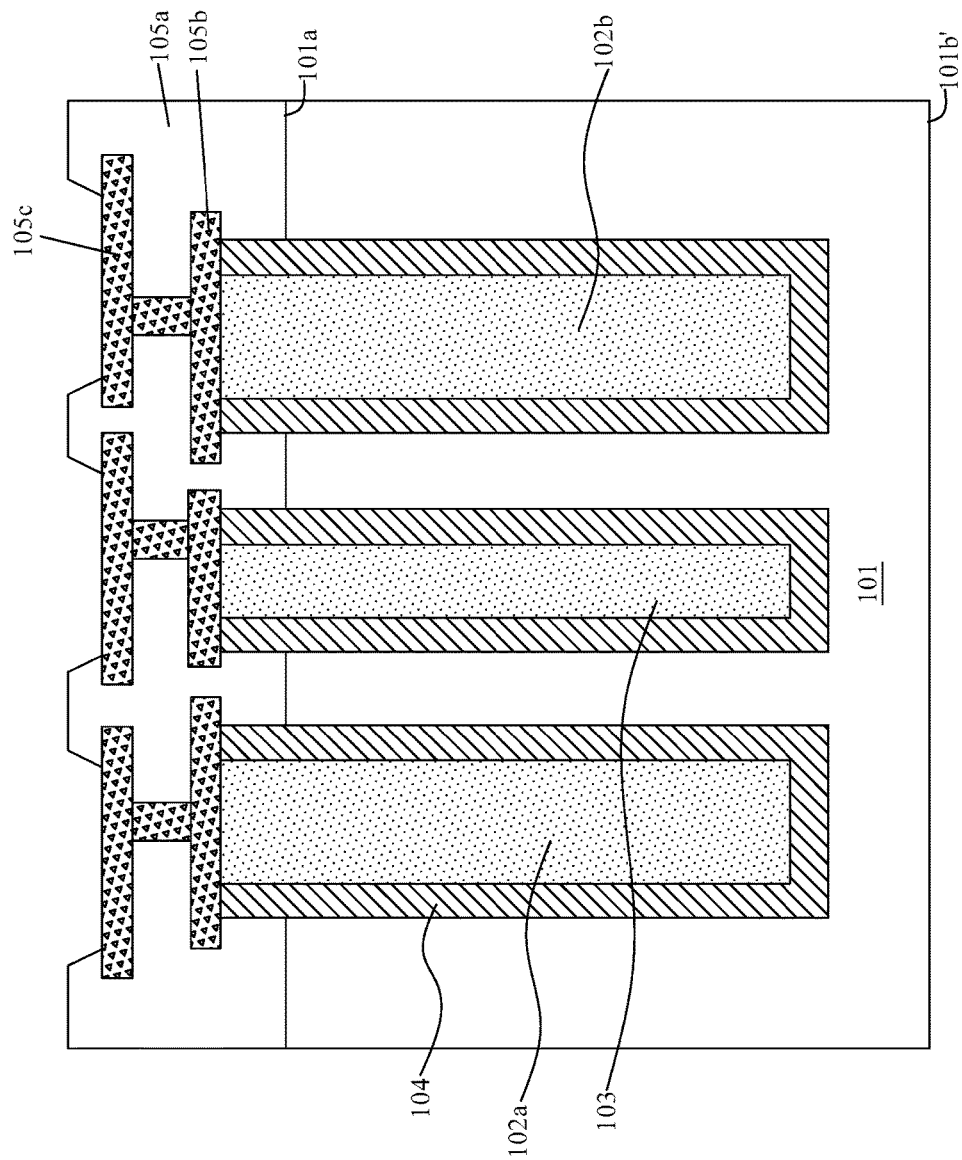

In some embodiments of the step 403, the first dielectric layer 105a is disposed over the third dielectric layer 108 as shown in FIG. 17, which is similar to FIG. 10. In some embodiments, the first dielectric layer 105a and the third dielectric layer 108 become a single dielectric layer as shown in FIG. 18.

In some embodiments of the step 404, the first metallic member 105b is disposed within the dielectric layer including the first dielectric layer 105a and the third dielectric layer 108. In some embodiments, the pad 105c is partially exposed from the dielectric layer as shown in FIG. 18, which is similar to FIG. 11.

Figure 19:
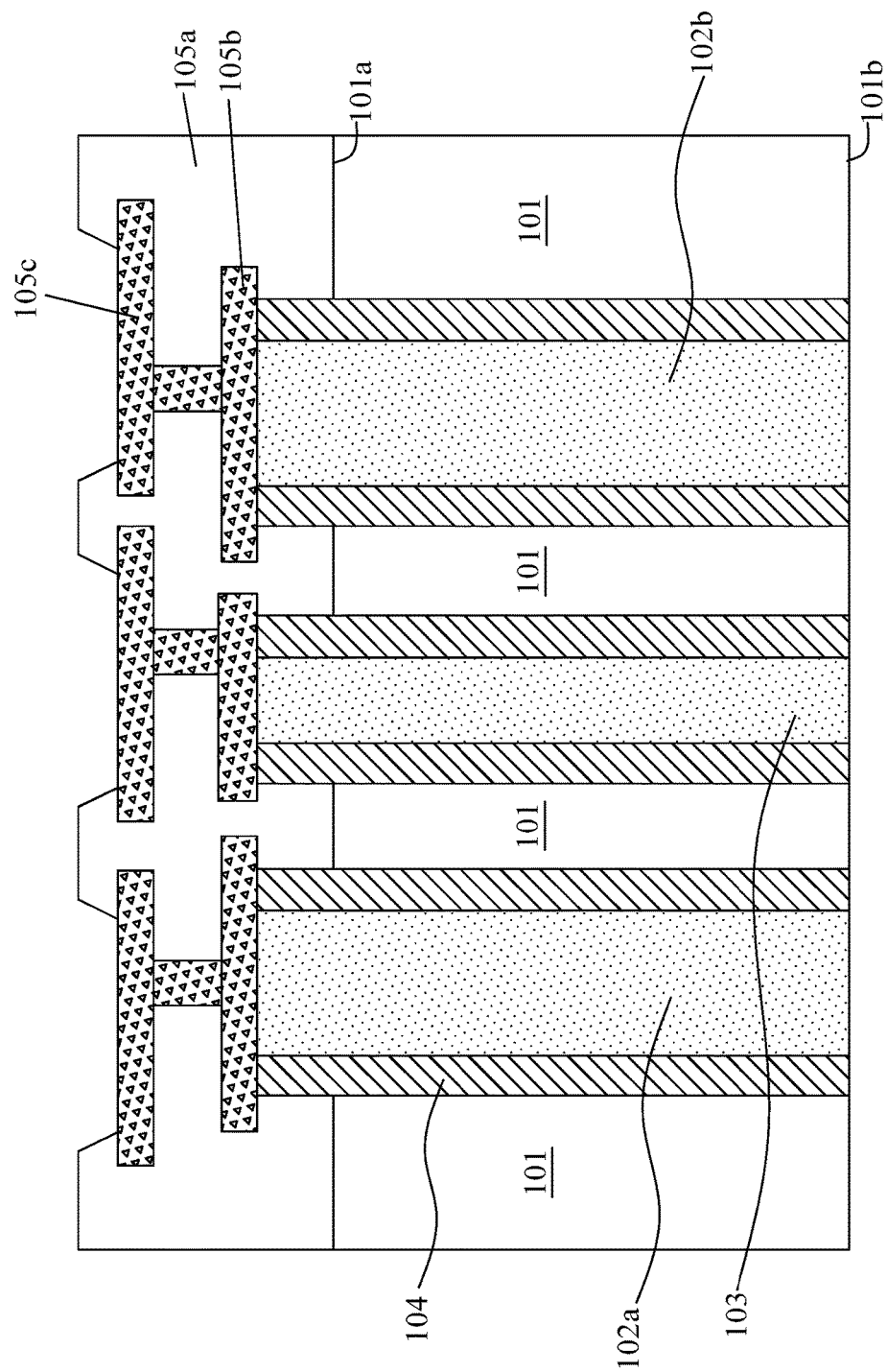
Figure 20:
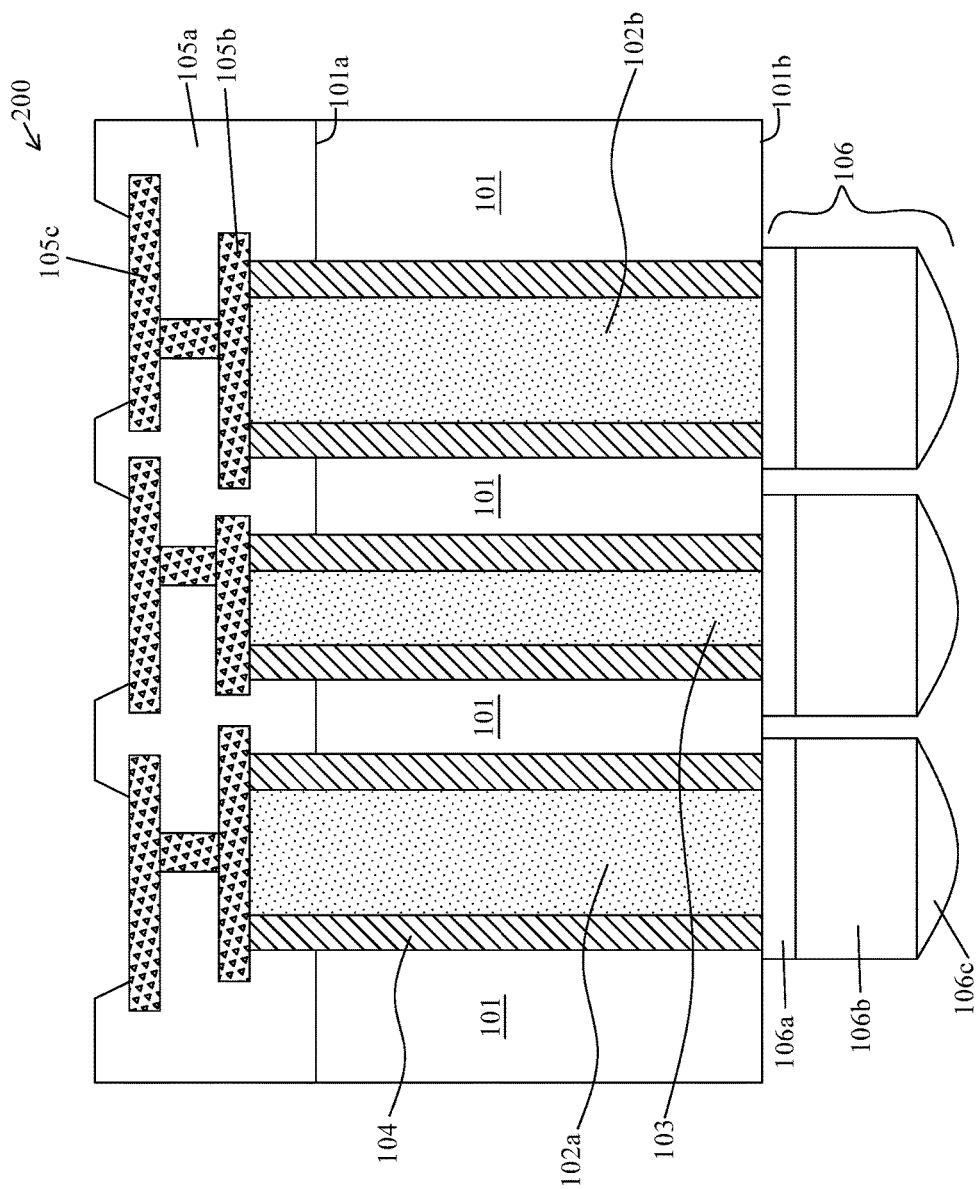

In some embodiments, the substrate 101 is thinned down as shown in FIG. 19, which is similar to FIG. 12. In some embodiments, a conductive bump 106 is disposed over the second side 101b of the substrate 101 as shown in FIG. 20. In some embodiments, the conductive bump 106 is electrically connected to the first via 102a and the second via 102b. In some embodiments, a semiconductor structure 200 is formed, which has a configuration similar to those described above or illustrated in FIG. 3.

Figure 21:
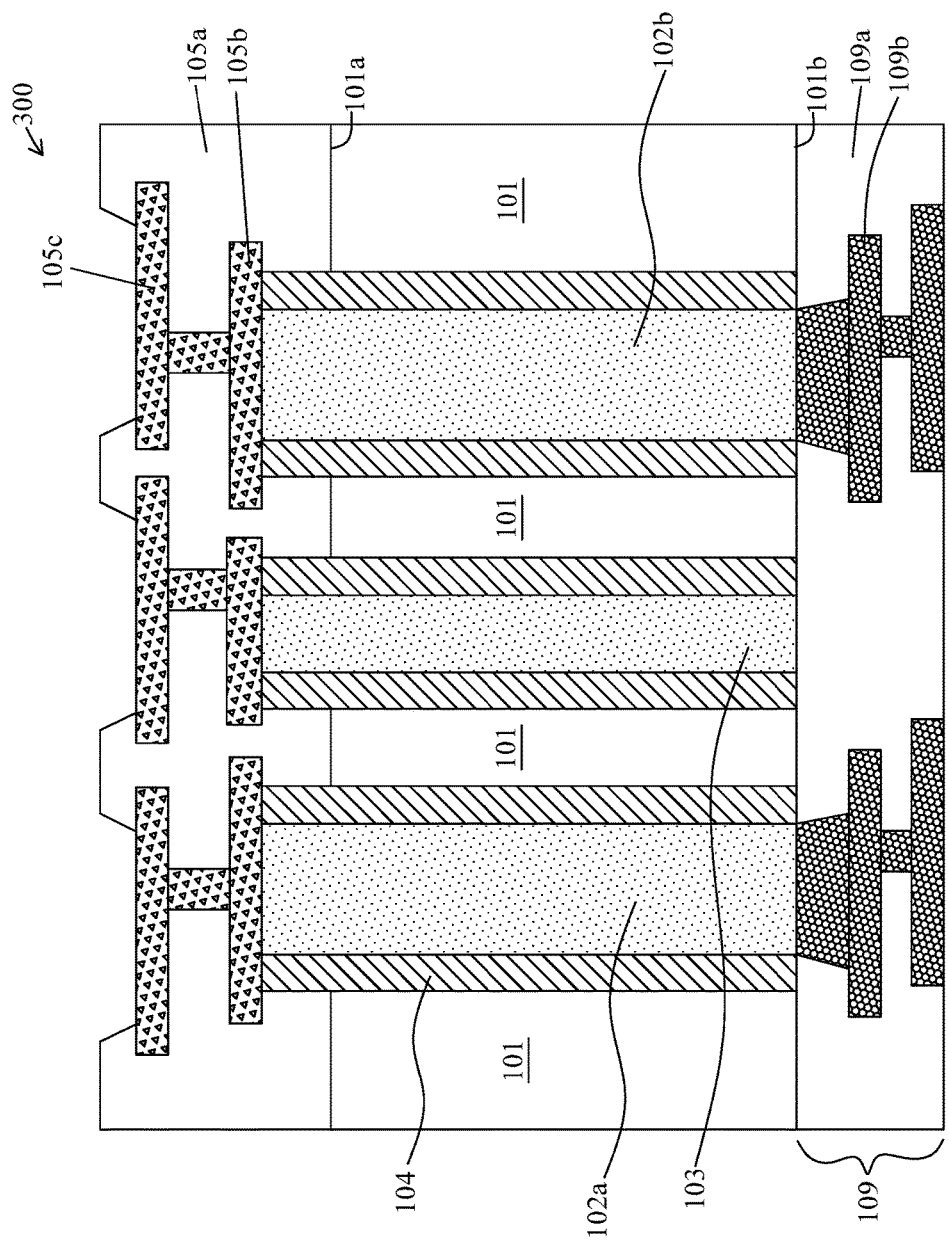

In some embodiments, a second RDL 109 is disposed over the second side 101b of the substrate 101 as shown in FIG. 21. In some embodiments, the second RDL 109 is electrically connected to the first via 102a and the second via 102b. In some embodiments, a semiconductor structure 300 is formed, which has a configuration similar to those described above or illustrated in FIG. 4.

In some embodiments, the first via 102a and the second via 102b are configured to connect to a signal source or transmit a signal. In some embodiments, the metallic structure 103 is configured to connect to a power or a ground. In some embodiments, the first via 102a and the second via 102b are isolated by the metallic structure 103, such that crosstalk between the first via 102a and the second via 102b can be minimized or prevented.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor structure, comprising:
   a substrate including a first side and a second side opposite to the first side;
   a first conductive via extending through the substrate;
   a second conductive via extending through the substrate;
   a metallic structure disposed between the first conductive via and the second conductive via; and
   first dielectric liners entirely surrounding the first conductive via and the second conductive via, respectively; and
   second dielectric liners only partially surrounding the metallic structure and only covering sides of the metallic structure facing the first conductive via and the second conductive via,
   wherein the first conductive via is isolated from the second conductive via by the metallic structure, the first conductive via and the second conductive via are configured to connect to a signal source or transmit a signal, and the metallic structure is configured to connect to a power or a ground, and
   wherein a cross-sectional shape of the metallic structure is different from a cross-sectional shape of the first conductive via and the second conductive via.

2. The semiconductor structure of claim 1, wherein a height of the metallic structure is substantially the same as a height of the first conductive via and a height of the second conductive via.

3. The semiconductor structure of claim 1, wherein a width of the first conductive via is substantially the same as a width of the second conductive via.

4. The semiconductor structure of claim 1, wherein the metallic structure is extended through the substrate.

5. The semiconductor structure of claim 1, further comprising a first dielectric layer and a first metallic member, wherein the first dielectric layer is disposed over the first side of the substrate, and the first metallic member is disposed within the first dielectric layer and electrically connected to the first conductive via, the second conductive via or the metallic structure.

6. The semiconductor structure of claim 5, wherein the first metallic member includes a pad partially exposed from the first dielectric layer.

7. The semiconductor structure of claim 5, wherein a portion of the first conductive via, a portion of the second conductive via and a portion of the metallic structure are disposed within the first dielectric layer.

8. The semiconductor structure of claim 1, further comprising a second dielectric layer and a second metallic member, wherein the second dielectric layer is disposed over the second side of the substrate, and the second metallic member is disposed within the second dielectric layer and electrically connected to the first conductive via and the second conductive via.

9. The semiconductor structure of claim 8, further comprising a conductive bump disposed over and electrically connected to the second metallic member.

10. The semiconductor structure of claim 1, further comprising a conductive bump disposed over the second side of the substrate and electrically connected to the first conductive via and the second conductive via.

11. A method of manufacturing a semiconductor structure, comprising:
    providing a substrate including a first side and a second side opposite to the first side;
    forming first dielectric liners and second dielectric liners;
    forming a first conductive via and a second conductive via in the first dielectric liners and a metallic structure between the second dielectric liners, the first conductive via, the second conductive via and the metallic structure extending from the first side of the substrate towards the second side of the substrate, a cross-sectional shape of the metallic structure being different from a cross-sectional shape of the first conductive via and the second conductive via;
    disposing a dielectric layer over the first side of the substrate; and
    forming a metallic member within the dielectric layer and over the first conductive via, the second conductive via or the metallic structure,
    wherein the metallic structure is disposed between the first conductive via and the second conductive via, the first conductive via and the second conductive via are configured to connect to a signal source or transmit a signal, and the metallic structure is configured to connect to a power or a ground, and
    wherein the first dielectric liners entirely surround the first conductive via and the second conductive via, respectively, and
    wherein the second dielectric liners only partially surrounds the metallic structure and only covers sides of the metallic structure facing the first conductive via and the second conductive via.

12. The method of claim 11, wherein the forming of the first conductive via, the second conductive via and the metallic structure includes removing a portion of the substrate to form a recess and disposing a conductive material within the recess.

13. The method of claim 12, further comprising disposing a dielectric liner conformal to the recess.

14. The method of claim 11, wherein the first conductive via, the second conductive via and the metallic structure are formed simultaneously.

15. The method of claim 11, wherein the forming of the metallic member includes forming a pad partially exposed from the dielectric layer and disposed over the first conductive via, the second conductive via or the metallic structure.

16. The method of claim 11, wherein the metallic member is electrically connected to the first conductive via, the second conductive via or the metallic structure.

17. The method of claim 11, wherein a third dielectric layer is disposed over the first side of the substrate prior to the formation of the first conductive via, the second conductive via and the metallic structure.

18. The method of claim 11, further comprising grinding the second side of the substrate to expose a portion of the first conductive via and a portion of the second conductive via from the substrate.

19. The method of claim 11, further comprising disposing a conductive bump over and electrically connected to the first conductive via and the second conductive via.

\* \* \* \* \*